(12) United States Patent
Wenning

(10) Patent No.: US 6,577,987 B1
(45) Date of Patent: Jun. 10, 2003

(54) OPERATIONAL MONITORING FOR A CONVERTER

(75) Inventor: Guido Wenning, Zurich (CH)

(73) Assignee: ABB Power Automation AG, Baden (CH)

( * ) Notice: Subject to any disclaimer, the term of this patent is extended or adjusted under 35 U.S.C. 154(b) by 179 days.

(21) Appl. No.: 09/715,019

(22) Filed: Nov. 20, 2000

(30) Foreign Application Priority Data

Nov. 19, 1999 (EP) .............................................. 99811073

(51) Int. Cl.$^7$ ................................................ G06F 11/30
(52) U.S. Cl. ........................... 702/183; 702/59; 702/81; 702/183; 702/188; 710/69; 710/65; 341/108; 341/156; 341/164; 324/512; 324/520
(58) Field of Search .............................. 702/57, 58, 59, 702/66, 67, 81, 82, 188, 193, 103, 117, 126, 183, 198, FOR 103, FOR 104, FOR 107, FOR 109, FOR 110, FOR 134, FOR 135, FOR 154, FOR 155, FOR 156, FOR 170, FOR 171; 341/110, 115–118, 120, 121, 126, 129, 132, 142, 144, 148, 154, 155, 158, 166; 340/870.21; 324/76.65, 76.79, 520, 521, 536

(56) References Cited

U.S. PATENT DOCUMENTS

| | | | |
|---|---|---|---|
| 4,215,412 A | | 7/1980 | Bernier et al. .............. 701/100 |
| 5,319,370 A | * | 6/1994 | Signore et al. .............. 341/120 |
| 5,321,403 A | * | 6/1994 | Eng, Jr. et al. .............. 341/168 |
| 6,087,948 A | * | 7/2000 | Oveby et al. ................ 340/635 |

FOREIGN PATENT DOCUMENTS

| | | |
|---|---|---|
| DE | 251659 A1 | 11/1987 |
| EP | 0883249 A2 | 12/1998 |

OTHER PUBLICATIONS

Arabi et al., Efficient and Accurate Testing of Analog–to–Digital Converters Using Oscillation–Test Method, IEEE, 97, pp. 348–352.*

* cited by examiner

*Primary Examiner*—Marc S. Hoff
*Assistant Examiner*—Elias Desta
(74) *Attorney, Agent, or Firm*—Burns, Doane, Swecker & Mathis, L.L.P.

(57) ABSTRACT

Monitoring a converter (1) includes detecting whether a value of an input variable (2) for the converter (1) assumes a first prescribed input reference value (41) and checking whether an output variable (3) from the converter (1) likewise assumes a corresponding, second prescribed output reference value (61). This means that the operation of the converter is tested only at occasional instants, specifically only using individual, prescribed values. The fact that only prescribed values (41, 61) are compared with instantaneous values of the input and output variables (2, 3) means that the invention can be implemented using very simple means. The method is particularly suitable for monitoring the operation of a converter (1) in a control or protective device for an electrical switchgear assembly. In this context, when a malfunction in the converter (1) is detected, all protective functions which are dependent on the converter (1) are preferably turned off.

10 Claims, 3 Drawing Sheets

US 6,577,987 B1

OPERATIONAL MONITORING FOR A CONVERTER

TECHNICAL FIELD

The invention relates to the field of protective technology, in particular for electrical switchgear assemblies. It relates to an apparatus and to a method for monitoring the operation of a converter in accordance with the preamble to patent claims 1 and 5.

PRIOR ART

Electrical switchgear assemblies, for example medium, high and low voltage switchgear assemblies, have control and protective devices. Protective devices must reliably detect, identify and locate electrical faults, for example short circuits or line interruptions, and must initiate suitable countermeasures in order to prevent faults from being propagated and system parts from being destroyed. At the same time, however, a protective device should not cause any system parts to be turned off unnecessarily. A protective device must therefore itself also have a high level of reliability. To this end, individual units of the protective device, in particular converters, need to be monitored. Examples of such converters are test amplifiers, digital-to-analog or analog-to-digital converters. A defect in a converter generally results in corruption of measured data and in a faulty response from the protective device.

In a generally known manner, operational monitoring is performed using a redundant design for units in a device: such a unit is of duplicate or triplicate design, and a lack of any match between output signals from the units is used to infer that a unit is malfunctioning. Such redundancy results in the costs of the unit being at least doubled or tripled, however. Another manner of monitoring the operation of an appliance is known from U.S. Pat. No. 4,215,412. In this case, control variables and output variables for an aircraft engine are measured while the engine is operating. A computer-based simulation model of the engine continuously simulates a response of the engine and of the output variables during operation using the measured control variables. To this end, a complex mathematical model with an appropriate level of computational complexity is used. If the continuously changing, calculated and measured output variables do not match, an indicator is activated for an operator. However, producing a simulation model, matching it to a given engine and performing continuous calculations during operation require a high level of complexity.

ILLUSTRATION OF THE INVENTION

It is therefore the object of the invention to provide an apparatus and a method for monitoring the operation of a converter of the type mentioned in the introduction which eliminates the aforementioned disadvantages.

This object is achieved by an apparatus and a method for monitoring the operation of a converter having the features of patent claims 1 and 5.

The invention's method for monitoring the operation of a converter involves detecting whether a value of an input variable for the converter assumes a first prescribed input reference value, and checking whether an output variable from the converter likewise assumes a corresponding, second prescribed output reference value.

This means that the operation of the converter is tested only at occasional instants, specifically only using individual, prescribed values. The fact that only prescribed values are compared with instantaneous values of the input and output variables means that the apparatus according to the invention can be produced using very simple means.

In one preferred variant of the invention, the prescribed values correspond to a value zero for a current, or to a value zero for a voltage, that is to say to a ground potential, and/or to a supply voltage for an electrical system.

The method according to the invention is particularly suitable for monitoring the operation of a converter in a control or protective device for an electrical switchgear assembly. In this context, when a malfunction in the converter is detected, all protective functions which are dependent on this converter are preferably turned off.

Further preferred embodiments can be found in the dependent patent claims.

BRIEF DESCRIPTION OF THE DRAWINGS

The invention is explained in more detail below with the aid of preferred illustrative embodiments which are shown in the accompanying drawings, in which.

The reference symbols used in the drawings are summarized in the list of reference symbols together with their meanings. In principle, identical parts are provided with identical reference symbols in the figures.

WAYS OF IMPLEMENTING THE INVENTION

Figure 1:
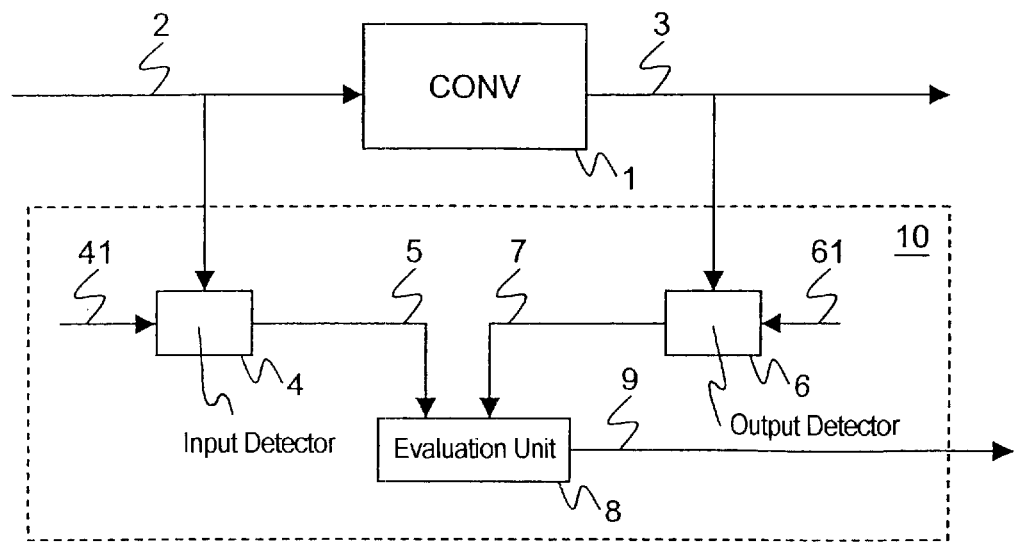
FIG. 1 is a schematic illustration of a structure of a converter having a monitoring apparatus according to the invention.

FIG. 1 is a schematic illustration of a structure of a converter 1 having a monitoring apparatus 10 in accordance with the invention. An input variable 2 for the converter 1 and an input reference value 41 are passed to an input detector 4. An output variable 3 from the converter 1 and an output reference value 61 are passed to an output detector 6. A digital input flag 5 from the input detector 4 and a digital output flag 7 from the output detector 6 are passed to an evaluation unit 8 to produce a status signal 9. Optionally, the input flag 5 is also passed to the output detector 6.

The method according to the invention works in the following manner: the input detector 4 continuously monitors the input variable 2. So long as a value of the input variable 2 lies outside a prescribed tolerance range about the input reference value 41, the input detector 4 sets the input flag 5 to a prescribed value, for example to the value zero. If the value of the input variable 2 is approximately the same as the input reference value 41, that is to say if it lies within the prescribed tolerance range about the input reference value 41, the input detector 4 detects a match between the input variable 2 and the input reference value 41. The input detector 4 thus responds and sets the input flag 5 to another value, for example to the value one. In the same way, the output detector 6 continuously compares a value of the output variable 3 with the output reference value 61. The output detector 6 forms the output flag 7 to indicate a match between the output variable 3 and the output reference value 61, that is to say to indicate whether the output variable 3 lies within a prescribed tolerance range about the output reference value 61. In one variant of the method according to the invention, the output variable 3 is compared only if the optional connection between the input flag 5 and the output detector 6 indicates a response from the input detector 4. The evaluation unit 8 receives the input flag 5 and the output flag 7 and uses these to form the status signal 9 in the following manner: if the input flag 5 and the output flag 7 both indicate a response from the appropriate detector 4 or 6 then the status signal 9 conveys correct operation of the converter 1. If there is no match between the input flag 5 and the output flag 7, then the status signal 9 conveys a malfunction in the converter 1. The status signal 9 can also be formed either continuously or else only if the input flag 5 indicates a response from the input detector 4.

In one variant of the invention, the comparison in the output detector 6 is carried out continuously, and the comparison in the input detector 4 and/or the formation of the status signal 9 is carried out only if there is a response from the output detector 6.

In a further variant of the invention, the evaluation unit 8 incorporates a converter delay time and compares the input flag 5 with an output flag 7 value which arises only after this delay time. This means that determination of whether both the input variable 2 and the output variable 3 lie within the respective prescribed tolerance range takes place on the basis of values of the input variable 2 and values of the output variable 3 which have been determined after having been shifted relative to one another by a delay time for the converter 1.

Figure 2:
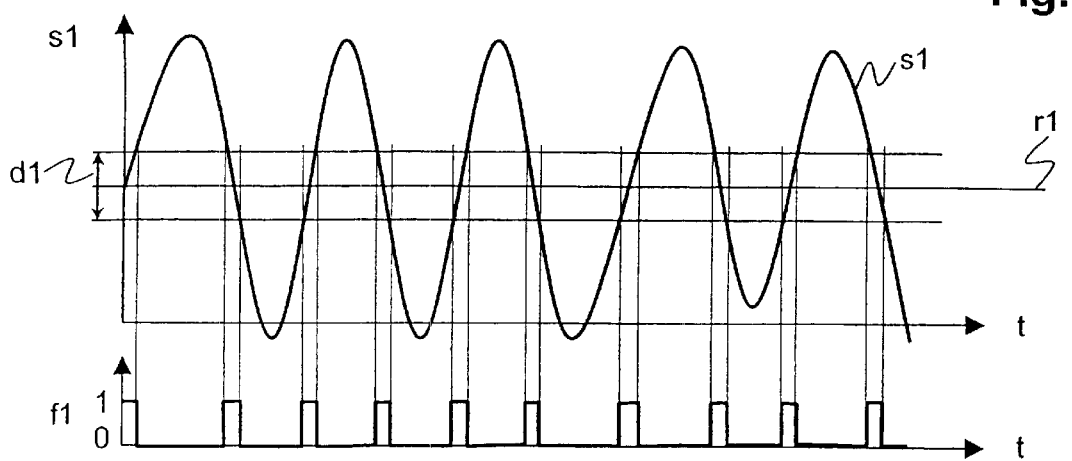
FIG. 2 shows a waveform for signals in accordance with the invention.
Figure 2:
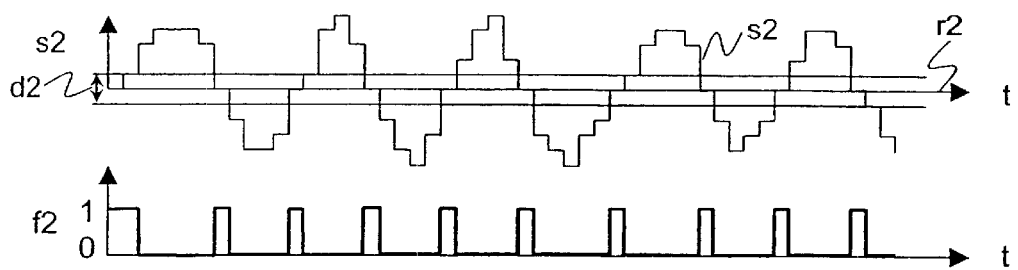
Figure 2:
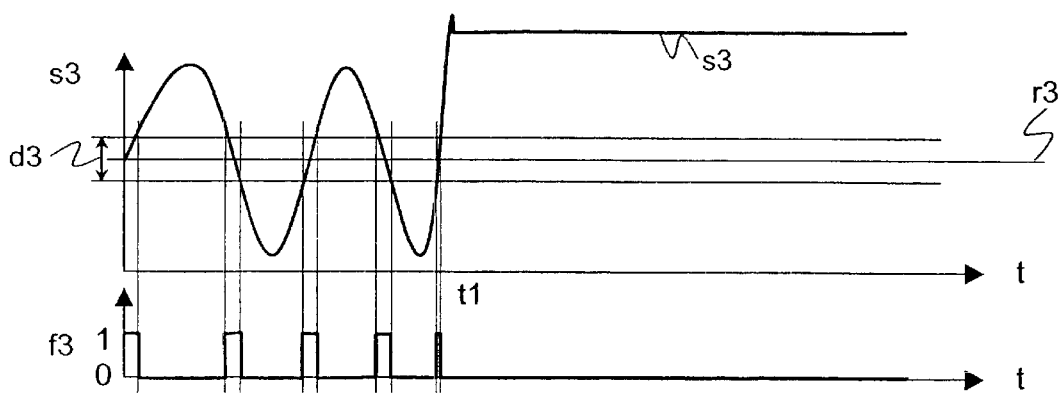
Figure 2:
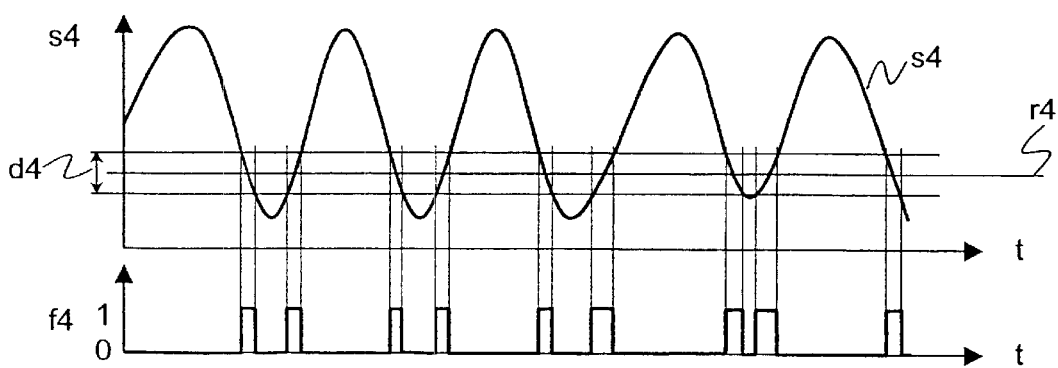

FIG. 2 shows, along a horizontal time axis t, a curve s1 for a first variable, a first reference value r1, a first tolerance range d1 and a curve f1 for a first flag, a curve s2 for a second variable, a second reference value r2, a second tolerance range d2 and a second flag f2, a curve s3 for a third variable, a third reference value r3, a third tolerance range d3 and a third flag f3, and also a curve s4 for a fourth variable, a fourth reference value r4, a fourth tolerance range d4 and a fourth flag f4. The first and second flags f1, f2 are set to a value one, in the manner described above, only if the first and second variables s1, s2 are situated within the first and second tolerance ranges d1, d2 about the first and second reference values r1, r2. The same applies in a similar manner to the third and fourth flags f3, f4. The first variable has a continuous curve s1 for its values, and the second variable has discrete values s2. The first and second variables correspond, by way of example, to an input variable 2 and an output variable 3, respectively, of a working analog/digital converter 1. In this case, the output variable from the converter 1 is in digitally coded form. In another variant of the invention, the converter 1 is an analog amplifier and, when the converter 1 is working, the curves for the input variable 2 and the output variable 3 both correspond approximately to the curve for the first variable. In a further variant of the invention, the converter 1 is a digital/analog converter and, when the converter 1 is working, the curves for the input variable 2 and the output variable 3 both correspond approximately to the curve for the second variable.

If the converter 1 is not working by reason of it driving/overriding the output variable 3 continuously to a maximum or a minimum after an instant t1, then a curve for the output variable 3 is produced in accordance with the curve s3. The corresponding curve f3 for an output flag 7 shows that there is never any response from the output detector 6 after the instant t1. This means that no match arises between input flags 5 and output flags 7 either. Consequently, a malfunction in the converter 1 is detected and conveyed by setting the status signal 9.

If the converter 1 is not working by reason of the output variable 3 having too great an offset, then, when an input variable 2 has a curve in accordance with s1 or s2, a curve for the output variable 3 is produced in accordance with the curve s4. The corresponding curve f4 for an output flag 7 shows that the output detector 6 responds at different instants than an input detector 4 for a curve in accordance with s1. This means that no match arises between input flags 5 and output flags 7 in this case either. Consequently, a malfunction in the converter 1 is detected and conveyed by setting the status signal 9.

The reference values 41, 61 are determined by tuning the converter 1, for example when equipment is brought. into service. If the converter 1 is an analog/digital converter, the input variable 2 preferably has a value zero connected as prescribed value, preferably a ground potential or a current zero. The defined input reference value 41 for which the input detector 4 responds is likewise a value zero. An offset in the converter 1 produces a particular value of the output variable 3 which is generally different than zero. This value of the output variable 3 is selected as the output reference value 61 for which the output detector 6 responds. The output reference value 61 corresponds to the input reference value 41 zero. If the converter 1 is a digital/analog converter, the input variable 2 is varied until the output variable 3 has a value zero. The corresponding value of the input variable 2 is selected as input reference value 41 and is assigned to an output reference value 61 zero. In a similar manner, tuning which uses a supply voltage or a rated voltage of a system as reference value for an analog side of a converter 1, instead of a ground potential, is carried out.

The invention's monitoring apparatus 10 for monitoring the operation of a converter 1, the converter 1 being an analog converter or an existing converter 1 in a system, thus has an input detector 4 for producing the input flag 5 on the basis of detection of the input reference value 41 for the input variable 2 for the converter 1, an output detector 6, 6', 6", 6'" for producing an output flag 7, 7', 7", 7'" on the basis of detection of an output reference value 61, 61', 61", 61'" for an output variable 3, 3', 31', 3'", assigned to the output detector 6, 6', 6", 6'", from the converter 1, and an evaluation unit 8 for comparing the results from the detectors, that is to say the input and output flags 5, 7, 7', 7", 7'", and for producing a status signal 9 for conveying a match between the flags 5, 7, 7', 7", 7'".

Figure 3:
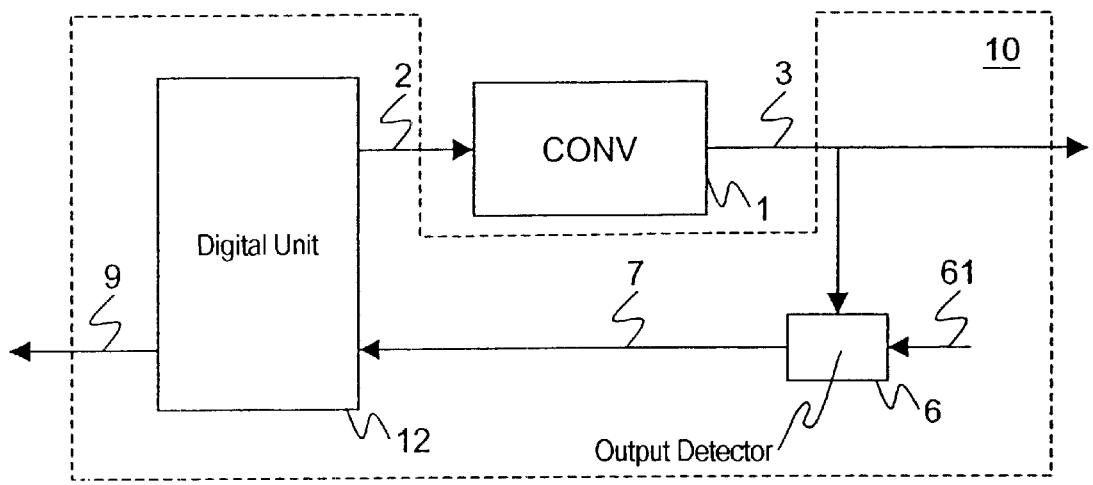
FIGS. 3 and 4 show structures of converter units having monitoring in accordance with the invention.

FIG. 3 shows a preferred variant of the invention: a monitoring apparatus 10 has a converter 1, an output detector 6 and a digital unit 12. The converter 1 is a digital/analog converter which receives the input variable 2 from the digital unit 12 in digitally coded form. The digital unit 12 receives the input variable 2 transmitted via an input (not shown), or produces the input variable 2 itself. The output detector 6 is an analog module which transmits the output flag 7 or analog flag to the digital unit 12. The analog flag indicates a match between the output variable 3 and the output reference value 61. The digital unit 12 has a programmable arithmetic unit, such as a microprocessor or an ASIC (Application-Specific Integrated Circuit) or FPGA (Field Programmable Gate Array) and/or a specially designed digital circuit. The above-described functions of the input detector 4 and of the evaluation unit 8 are realized in the digital unit 12. To this end, the latter preferably forms a digital flag which indicates a match between the input variable 2 and the input reference value 41. The digital flag is preferably produced by an internal variable or an internal signal in the digital unit 12.

Figure 4:
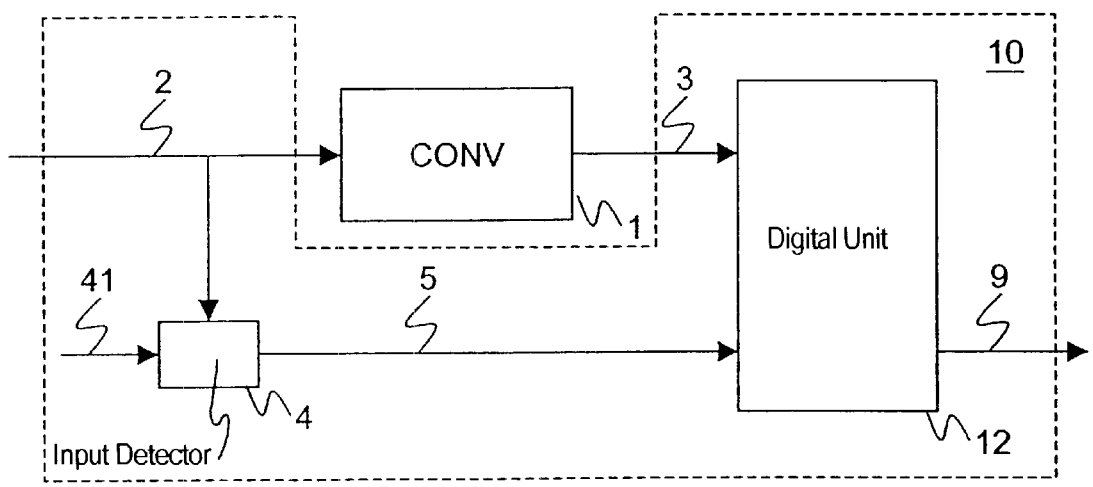

FIG. 4 shows a further preferred variant of the invention. A monitoring apparatus 10 has a converter 1, an input detector 4 and a digital unit 12. The converter 1 is an analog/digital converter which transmits the output variable 3 in digitally coded form to a digital unit 12. The digital unit 12 transmits the output variable 3 via an output (not shown) and/or processes it itself. The input detector 4 is an analog module which transmits the input flag 5 or analog flag to the digital unit 12. The analog flag indicates a match between the input variable 2 and the input reference value 41. The digital unit 12 has a programmable arithmetic unit, such as a microprocessor or an ASIC or FPGA and/or a specially designed digital circuit. The above-described functions of the output detector 6 and of the evaluation unit 8 are realized in the digital unit 12. To this end, the latter forms a digital flag which indicates a match between the output variable 3 and the output reference value 61. The digital flag is preferably produced by an internal variable or an internal signal in the digital unit 12.

Figure 5:
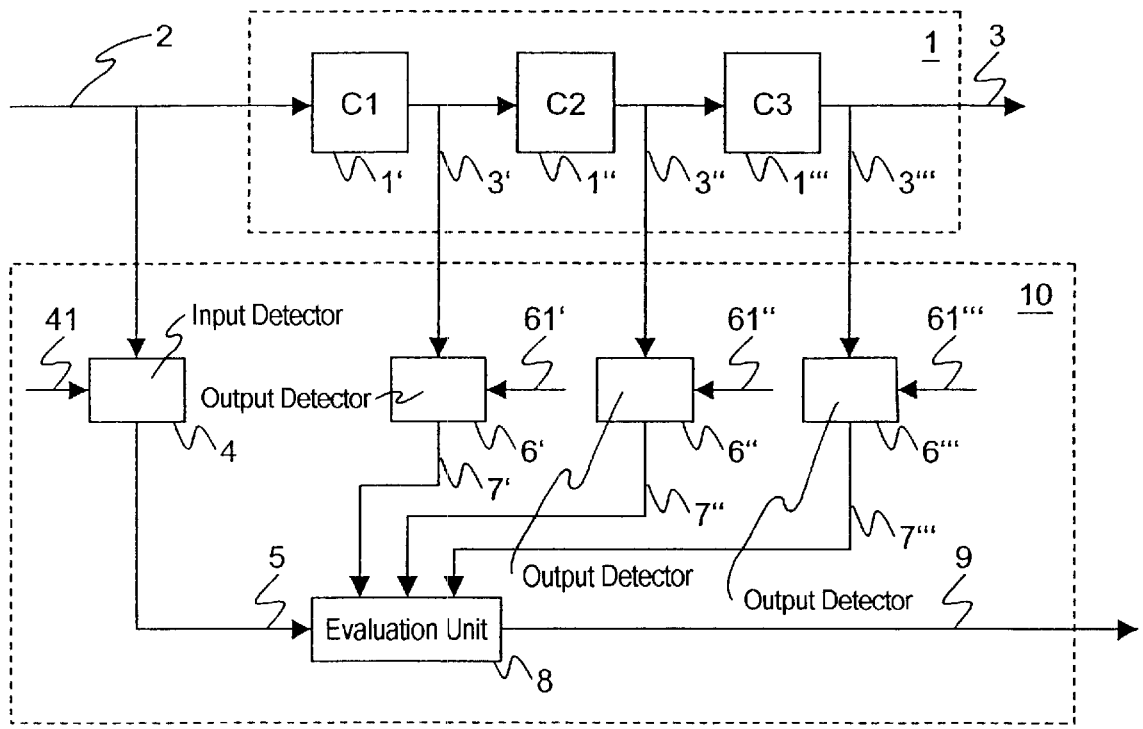
FIG. 5 is a schematic illustration of a structure of a converter having a plurality of converter stages and a monitoring apparatus in accordance with the invention.

FIG. 5 shows a further preferred variant of the invention. In this figure, the converter 1 comprises a plurality of cascaded converter sections 1', 1", 1''' whose output variables 3', 3", 3''' are passed to output detectors 6', 6", 6''' to form output flags 7', 7", 7'''. The input flag 5 and the output flags 7', 7", 7''' are evaluated by the evaluation unit 8, which, if there is no match between the input flag 5 and/or the output flags 7', 7", 7", infers that a converter section 1', 1", 1''' is malfunctioning.

In one preferred variant of the invention, the prescribed reference values correspond to a value zero for a current, or to a value zero for a voltage, that is to say to a ground potential, and/or to a supply voltage for an electrical system. Such reference values have the advantage that they occur throughout a system and are defined. If a reference value for an analog variable corresponds to a ground potential or to a value zero, then the analog detector is simply an analog comparator whose changeover threshold is the same as an upper limit of the prescribed tolerance range about the reference value zero. If an absolute value of the analog variable falls below the upper limit of the tolerance range, the comparator sets its output signal or analog flag to the value one and thus indicates that the analog variable has the prescribed reference value zero.

The method according to the invention is particularly suitable for monitoring the operation of a converter in a control or protective device for an electrical switchgear assembly. By way of example, digital/analog converters 1 are used in order to convert signals 2 transmitted digitally via glass fibers from protective appliances to analog signals 3. These analog signals 3 are passed to analog inputs of existing prior protective appliances. Preferably, a monitoring apparatus 10 according to the invention based on the structure in FIG. 3 is used for such a digital/analog converter 1. It is preferably used to monitor voltages using reference values zero which correspond to ground potential. Currents are also preferably monitored using reference values zero. To tune monitoring for a converter 1 processing a current measurement, an appropriate section of line is switched to zero current.

In the case of a converter 1 processing a current measurement, a malfunction in a converter 1 which causes the output variable 3 from the converter 1 to be overridden cannot be distinguished from a short circuit current in the system without delay, that is to say in a time during which a protective device needs to react. In this case, the invention enables the malfunction to be detected.

When monitoring the operation of a converter 1 in a protective device for an electrical switchgear assembly, detection of a malfunction in the converter 1 preferably involves the output variable 3 being marked as invalid, for example by transmitting an appropriate status signal. In this case, protective functions which are dependent on the converter 1 are preferably turned off. This is permissible because faults in switchgear, assemblies occur very rarely. In this context, the risk of an operating fault caused by a defective converter 1 is advantageously greater than the risk of a fault not detected in optimum fashion.

The invention has the advantage that monitoring can be realized using very simple means. By way of example, only one additional analog module is required for a digital/analog converter or an analog/digital converter, while the rest of the functions are realized in a digital unit 12, for example a programmable digital unit, which is present anyway. Monitoring according to the invention can also be implemented subsequently in an existing converter.

| List of reference symbols | |
|---|---|
| 1 | Converter |
| 1', 1", 1''' | Converter section |
| 2 | Input variable |
| 3, 3', 3", 3''' | Output variable |
| 4 | Input detector |
| 5 | Input flag |
| 6, 6', 6", 6''' | Output detector |
| 7, 7', 7", 7''' | Output flag |
| 8 | Evaluation unit |
| 9 | Status signal |
| 10 | Monitoring apparatus |
| 12 | Digital unit |
| 41 | Input reference value |
| 61, 61', 61", 61''' | Output reference value |
| s1, s2, s3, s4 | First, second, third and fourth curve |
| r1, r2, r3, r4 | First, second, third and fourth reference value |
| d1, d2, d3, d4 | First, second, third and fourth tolerance range |
| f1, f2, f3, f4 | First, second, third and fourth flag |

What is claimed is:

1. A monitoring apparatus for monitoring the operation of a converter having means for monitoring an input variable and at least one output variable, characterized in that the monitoring apparatus has an input detector for detecting an input reference value for an input variable for the converter, an output detector for detecting an output reference value for an output variable, and an evaluation unit for comparing results from the input detector and from the output detector and for producing a corresponding status signal which conveys correct operation or a malfunction in the converter.

2. The monitoring apparatus as claimed in claim 1, characterized in that the prescribed reference values correspond to a value zero for a voltage or for a current.

3. The monitoring apparatus as claimed in claim 1, characterized in that the converter is a digital/analog converter, the output detector is an analog detector, and the input detector and the evaluation unit are produced in one digital unit.

4. The monitoring apparatus as claimed in claim 1, characterized in that the converter is an analog/digital converter, the input detector is an analog detector, and the output detector and the evaluation unit are produced in one digital unit.

5. A method for monitoring the operation of a converter, characterized by determination of whether an input variable for the converter lies within a first prescribed tolerance range about an input reference value, determination of whether an output variable from the converter lies within a second prescribed tolerance range about an output reference value, and, if both the input variable and the output variable lie within the respective prescribed tolerance range for the respective reference value, the converter being established to be operating correctly, and otherwise the converter being established to be malfunctioning.

6. The method as claimed in claim 5, characterized in that the input reference value or the output reference value corresponds to a value zero for a voltage or for a current.

7. The method as claimed in claim 5, characterized in that, once it has been ascertained that the converter is malfunctioning, the output variable is marked as invalid.

8. The method as claimed in claim 5, characterized in that, once it has been ascertained that the converter is malfunctioning, protective functions of a protective device for an electrical switchgear assembly which are dependent on the converter are turned off.

9. The method as claimed in claim 5, characterized in that determination of whether both the input variable and the output variable lie within the respective prescribed tolerance range takes place on the basis of values of the input variable and values of the output variable which have been determined after having been shifted relative to one another by a delay time for the converter.

10. The method as claimed in claim 5, characterized in that the output variable is compared with the output reference value depending on whether the input variable for the converter lies within the first prescribed tolerance range for the input reference value.

* * * * *